(12) United States Patent
Shi et al.

(10) Patent No.: US 11,950,053 B2
(45) Date of Patent: Apr. 2, 2024

(54) MEMS CHIP

(71) Applicant: AAC ACOUSTIC TECHNOLOGIES (SHENZHEN) CO., LTD., Shenzhen (CN)

(72) Inventors: Zhengyu Shi, Shenzhen (CN); Linlin Wang, Shenzhen (CN); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 151 days.

(21) Appl. No.: 17/739,202

(22) Filed: May 9, 2022

(65) Prior Publication Data
US 2023/0199408 A1 Jun. 22, 2023

(30) Foreign Application Priority Data
Dec. 20, 2021 (CN) .......................... 202123219722.0

(51) Int. Cl.
*H04R 19/04* (2006.01)
*B81B 3/00* (2006.01)
*H04R 7/04* (2006.01)
*H04R 7/18* (2006.01)

(52) U.S. Cl.
CPC ............ *H04R 19/04* (2013.01); *B81B 3/0045* (2013.01); *H04R 7/04* (2013.01); *H04R 7/18* (2013.01); *B81B 2201/0257* (2013.01); *H04R 2201/003* (2013.01)

(58) Field of Classification Search
CPC ............ H04R 19/04; H04R 7/04; H04R 7/18
See application file for complete search history.

(56) References Cited

U.S. PATENT DOCUMENTS

| | | | |
|---|---|---|---|
| 10,343,898 B1 * | 7/2019 | Chen | ........................ H04R 7/08 |
| 2007/0154040 A1 * | 7/2007 | Chen | ...................... H04R 19/04 |
| | | | 381/174 |
| 2010/0158279 A1 * | 6/2010 | Conti | ................... H04R 19/005 |
| | | | 381/174 |

* cited by examiner

*Primary Examiner* — Sunita Joshi
(74) *Attorney, Agent, or Firm* — W&G Law Group

(57) ABSTRACT

The present invention discloses a MEMS chip including a substrate with a back cavity; a capacitance system disposed on the substrate including a back plate, a membrane opposite to the back plate forming an inner cavity; a protruding portion accommodated in the inner cavity, fixed on one of the back plate and the membrane and spaced apart from the other along a vibration direction; a support system configured to support the capacitance system, including a first fixation portion suspending the membrane on the substrate, and a second fixation portion suspending the back plate on the substrate; the protruding portion comprises an annular first protruding portion and an annular second protruding portion surrounding the first protruding portion. The MEMS chip has higher sensitivity, higher resonance frequency and higher low frequency property.

8 Claims, 5 Drawing Sheets

A-A

B-B

MEMS CHIP

FIELD OF THE PRESENT INVENTION

The present invention relates to micro-electromechanical systems, especially relates to a MEMS chip applied in mobile device.

DESCRIPTION OF RELATED ART

Micro-Electro-Mechanical System (MEMS) chips are widely applied in acoustic components, such as MEMS condenser microphone. In related art, the MEMS chip is sealed in a shell with an accommodation space. The MEMS chip includes a substrate with a back cavity and a capacitance system disposed on the substrate. The capacitance system includes a membrane and a back plate arranged at an interval. A sound hole is provided on the shell communicating the back cavity, thus allowing the membrane to move under external pressure wave.

In related art, when whole edge of the membrane is fixed on the substrate, the internal stress of the membrane results in a tense state, thus improving the stiffness of the membrane. Under this condition, the sensitivity of the MEMS chip would reduce with the increase of the membrane stiffness. When the edge of the membrane is partially fixed on the substrate, a leakage path formed between the substrate and the membrane may reduce the resonance frequency and the low frequency property of the MEMS chip.

Therefore, it is necessary to provide an improved MEMS chip to overcome the problems mentioned above.

SUMMARY OF THE INVENTION

The main purpose of the present invention is to provide a MEMS chip with higher sensitivity, higher resonance frequency and higher low frequency property.

To achieve the object mentioned above, the present invention provides a MEMS chip includes a substrate with a back cavity; a capacitance system disposed on the substrate, including: a back plate; a membrane opposite to the back plate forming an inner cavity; and a protruding portion accommodated in the inner cavity, fixed on one of the back plate and the membrane and spaced apart from the other along a vibration direction; a support system configured to support the capacitance system, including: a first fixation portion suspending the membrane on the substrate; and a second fixation portion suspending the back plate on the substrate; wherein the protruding portion comprises an annular first protruding portion and an annular second protruding portion surrounding the first protruding portion.

Further, a projection of the first protruding portion along the vibration direction is located in the back cavity; a projection of the second protruding portion along the vibration at least partially overlaps with the back cavity.

Further, the protruding portion comprises a plurality of the first protruding portions spaced apart from each other; the first protruding portions are arranged in an annular manner.

Further, the protruding portion includes a plurality of the second protruding portions spaced apart from each other; the second protruding portions are arranged in an annular manner.

Further, the back plate is located on one side of the membrane away from the back cavity; the first fixation portion is in an annular shape; the second fixation portion is located inside the first fixation portion and spaced apart from the first fixation portion.

Further, the protruding portion extends from the back plate towards the membrane; the membrane includes a central portion and an edge portion surrounding the central portion; along the vibration direction, the first protruding portion faces the central portion and the second protruding portion faces the edge portion.

Further, the membrane is located on one side of the back plate away from the back cavity; part of the membrane recessed towards the back plate forming the first protruding portion and the second protruding portion.

Further, a plurality of through holes is provided on the back plate; the through holes penetrate the back plate along the vibration direction, connecting the back cavity and the inner cavity.

Further, the capacitance system further includes a plurality of elastic arms connecting the edge portion of the membrane and the first fixation portion.

BRIEF DESCRIPTION OF THE DRAWINGS

The present invention will hereinafter be described in detail with reference to an exemplary embodiment. To make the technical problems to be solved, technical solutions and beneficial effects of present invention more apparent, the present invention is described in further detail together with the figures and the embodiment. It should be understood the specific embodiment described hereby is only to explain this disclosure, not intended to limit this disclosure.

DETAILED DESCRIPTION OF THE EXEMPLARY EMBODIMENTS

Figure 1:
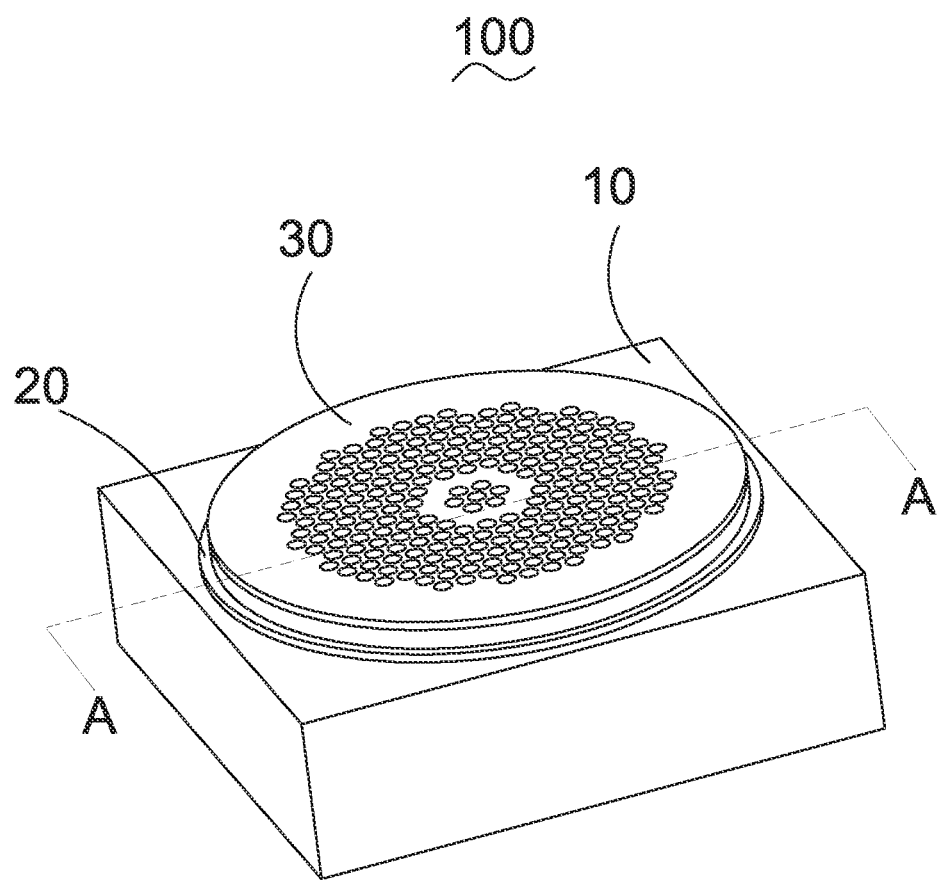
FIG. 1 is an isometric view of a MEMS chip in accordance with an exemplary embodiment of the present invention.
Figure 2:
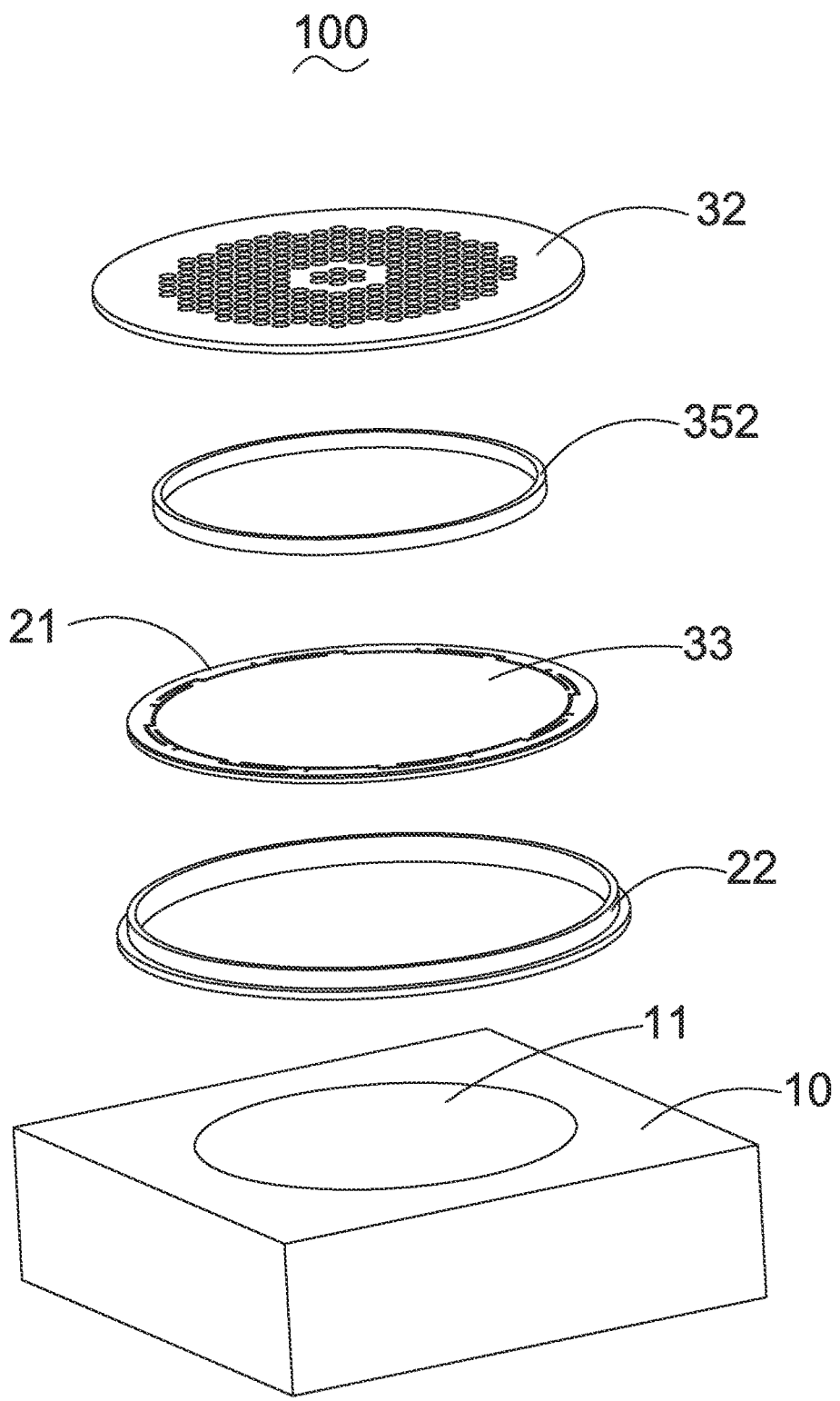
FIG. 2 is an isometric and exploded view of the MEMS chip in FIG. 1.
Figure 3:
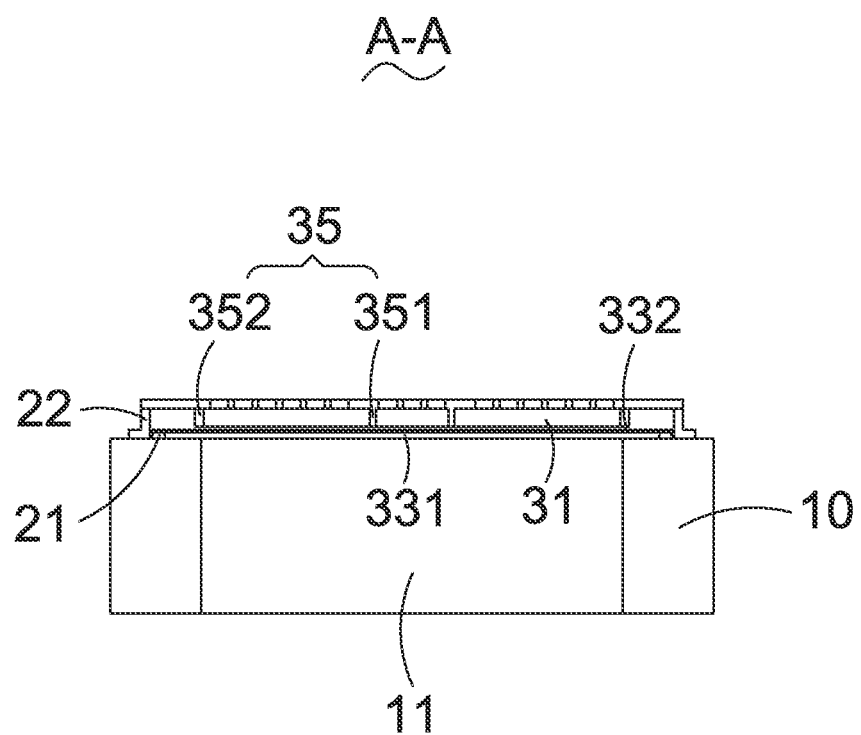
FIG. 3 is a cross-sectional view of the MEMS chip taken along line A-A in FIG. 1.
Figure 4:
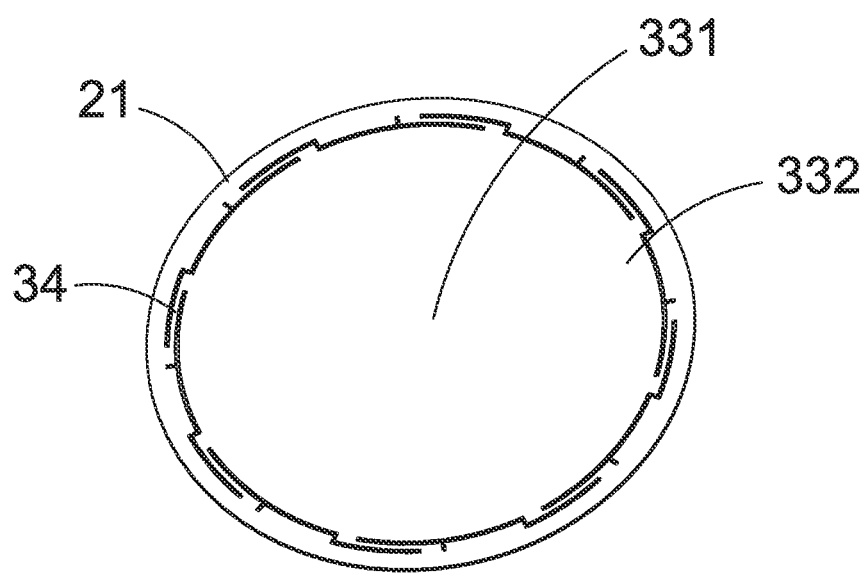
FIG. 4 is an isometric view of a membrane of the MEMS chip in FIG. 1.

The present invention will hereinafter be described in detail with reference to an exemplary embodiment. To make the technical problems to be solved, technical solutions and beneficial effects of the present invention more apparent, the present invention is described in further detail together with the figure and the embodiments. It should be understood the specific embodiments described hereby is only to explain the disclosure, not intended to limit the disclosure.

It should be noted that the description of "first", "second" and the like in the present invention is only used for description purposes, and cannot be understood as indicating or implying its relative importance or implying the number of indicated technical features. Thus, a feature defined as "first" or "second" may include at least one such feature, either explicitly or implicitly. In addition, the technical solutions among the various embodiments can be combined with each other, but it must be based on that it can be realized by ordinary technicians. When the combination of the technical solutions is contradictory or cannot be realized, it should be considered that the combination of the technical solutions does not exist, nor is it within the scope of protection required by the present invention.

Please refer to FIGS. 1-4 together, a MEMS chip 100 provided by an exemplary embodiment of the present invention includes a substrate 10 with a back cavity 11, a support system 20 fixed on the substrate 10, and a capacitance system 30 disposed on the substrate 10. The support system 20 is configured to support the capacitance system 30 on the back cavity 11.

Specifically, the capacitance system 30 includes a back plate 32 and a membrane 33 opposite to the back plate 32. The back plate 32 and the membrane 33 are arranged at an interval to form an inner cavity 31, which provides vibration space for the membrane 33. The capacitance value of the capacitance system 30 varies with the distance between the back plate 32 and the membrane 33 when the membrane 33 vibrates under acoustic wave, therefore achieving acousto-electric conversion.

The support system 20 includes a first fixation portion 21 suspending the membrane 33 on the substrate 10, and a second fixation portion 22 suspending the back plate 32 on the substrate 10. In this embodiment, the first fixation portion 21 is in an annular shape. The membrane 33 is located inside the first fixation portion 21. Moreover, the membrane 33 includes a central portion 331 and an edge portion 332 surrounding the central portion 331. The capacitance system 30 further includes a plurality of elastic arms 34 connecting the edge portion 332 of the membrane 33 and the first fixation portion 21. The elastic arms 34 are arranged spaced apart from each other, surrounding the membrane 33 in a circumferential manner. Therefore, the edge portion 332 of the membrane 33 is partially fixed on the substrate 10, thus allowing the internal stress relief during vibration, reducing the stiffness of the membrane 33 and improving the sensitivity of the MEMS chip 100. It can be understood that one end of the elastic arm 34 is fixed on the edge portion 332 and the other end of the elastic arm 34 is fixed on the first fixation portion 21.

In this embodiment, the back plate 32 is located on one side of the membrane 33 away from the back cavity 11. Furthermore, the capacitance system 30 includes a protruding portion 35 fixed on the back plate 32 and accommodated in the inner cavity 31. The protruding portion 35 is spaced apart from the membrane 33 along a vibration direction of the membrane 33. It can be understood that the protruding portion 35 extends from one surface of the back plate 32 facing the membrane 33 towards the membrane 33. In another word, along the vibration direction, a length of the protruding portion 35 is smaller than a distance between the back plate 32 and the membrane 33.

Moreover, the protruding portion 35 includes a first protruding portion 351 located in a central position, and a second protruding portion 352 surrounding the first protruding portion 351. In this embodiment, the first protruding portion 351 and the second protruding portion 352 are both in an annular shape. Obviously, a diameter of the second protruding portion 352 is larger than that of the first protruding portion 351.

In this embodiment, along the vibration direction, the first protruding portion 351 faces the central portion 331 of the membrane 33. That is, a projection of the first protruding portion 351 along the vibration direction is located in the back cavity 11. Further, the second protruding portion 352 faces the edge portion 332. Similarly, a projection of the second protruding portion 352 along the vibration at least partially overlaps with the back cavity 11. In other embodiment, the protruding portion 35 includes a plurality of the first protruding portions 351 spaced apart from each other; the first protruding portions 351 are arranged as a ring; similarly, the protruding portion 35 includes a plurality of the second protruding portions 352 spaced apart from each other; the second protruding portions 352 are arranged as a ring. Therefore, the stiffness of the membrane 33 could be adjusted by changing the diameter of the first protruding portion 351 and the second protruding portion 352, effectively improving the sensitivity of the MEMS chip 100.

Figure 5:
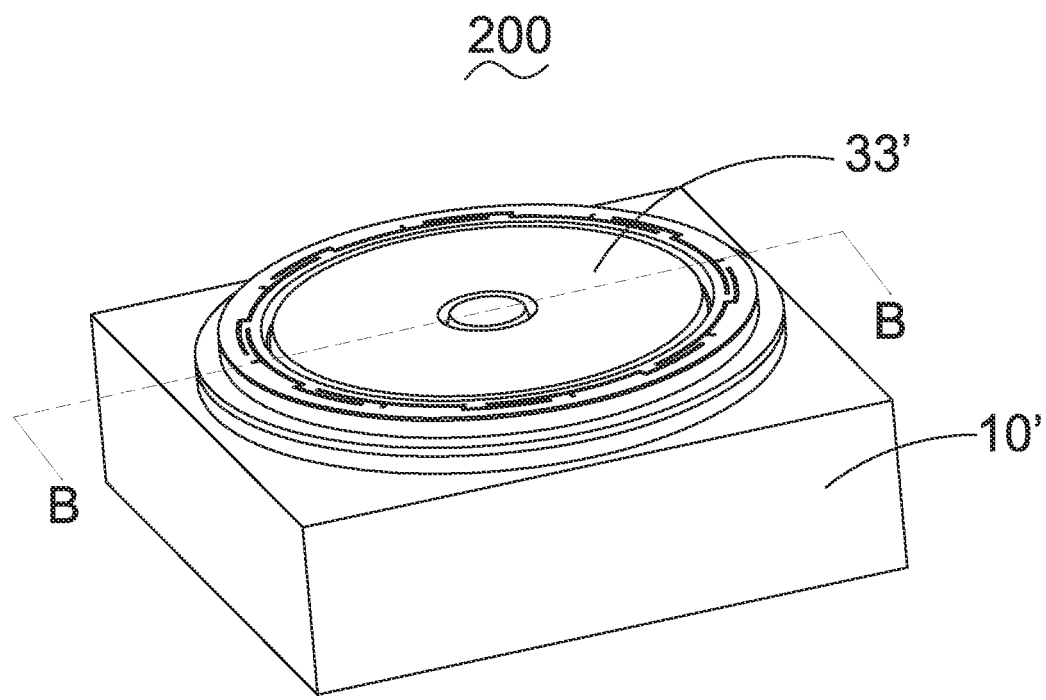
FIG. 5 is an isometric view of a MEMS chip in accordance with another exemplary embodiment of the present invention.
Figure 6:
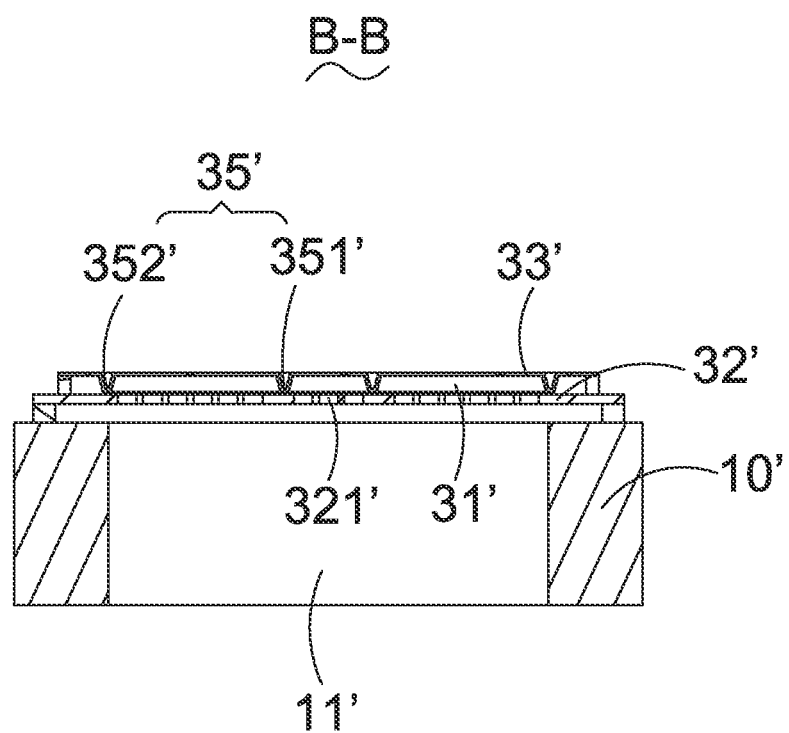
FIG. 6 is a cross-sectional view of the MEMS chip taken along line B-B in FIG. 5.
Figure 7:
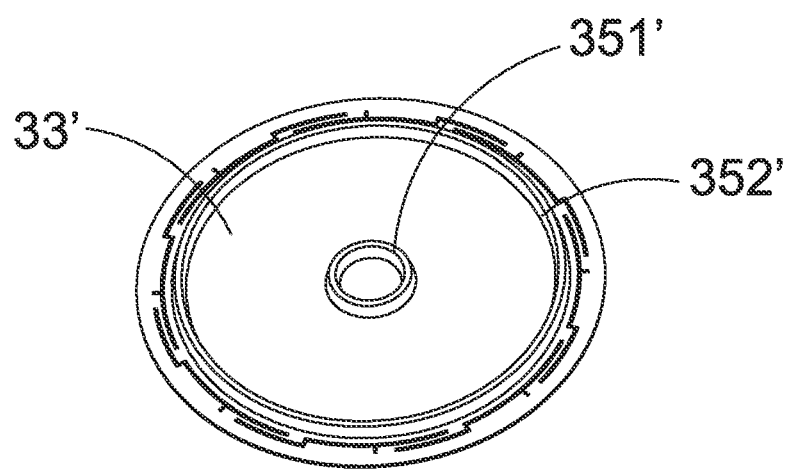
FIG. 7 is an isometric view of a membrane of the MEMS chip in FIG. 5.

Please refer to FIGS. 5-7, a MEMS chip 200 is provided in other embodiment of the present invention. Compared with the MEMS chip 100, the difference of the MEMS chip 200 is that the membrane 33' is located on one side of the back plate 32' away from the substrate 10'. In this embodiment, the protruding portion 35' is provided on the membrane 33'. Specifically, part of the membrane 33' recesses towards the back plate 32' forming the first protruding portion 351' and the second protruding portion 352'. The location feature of the first protruding portion 351' and the second protruding portion 352' is same as that in the MEMS chip 100. It can be understood that a plurality of through holes 321' is provided on the back plate 32'; the through holes 321' penetrate the back plate 32' along the vibration direction, connecting the back cavity 11' and the inner cavity 31'.

Compared with the related art, in the embodiments of the present invention, the MEMS chip includes a substrate, a membrane suspended by a first fixation portion, and a back plate suspended by the second fixation portion. The membrane is fixed to the first fixation portion via a plurality of adjacent elastic arms. In this manner, the membrane could release the internal stress via vibration, thus reducing the stiffness of the membrane and improving the sensitivity of the MEMS chip. The MEMS chip further includes an annular first protruding portion and an annular second protruding portion fixed on the membrane or the back plate; the first protruding portion and the second protruding portion are both located between the membrane and the back plate, effectively reducing the air leakage and improving the low frequency property of the MEMS chip. By adjusting the diameter of the first protruding portion and the second protruding portion, the resonance frequency of the MEMS chip could be accordingly increased.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:
1. A MEMS chip comprising:
a substrate with a back cavity;
a capacitance system disposed on the substrate, comprising:
a back plate;
a membrane opposite to the back plate forming an inner cavity; and a protruding portion accommodated in the inner cavity, fixed on one of the back plate and the membrane and spaced apart from the other along a vibration direction;

a support system configured to support the capacitance system, comprising:
a first fixation portion suspending the membrane on the substrate; and
a second fixation portion suspending the back plate on the substrate; wherein the protruding portion comprises an annular first protruding portion and an annular second protruding portion surrounding the first protruding portion; wherein
the back plate is located on one side of the membrane away from the back cavity; the first fixation portion is in an annular shape; the second fixation portion is located inside the first fixation portion and spaced apart from the first fixation portion.

2. The MEMS chip as described in claim 1, wherein a projection of the first protruding portion along the vibration direction is located in the back cavity, a projection of the second protruding portion along the vibration at least partially overlaps with the back cavity.

3. The MEMS chip as described in claim 1, wherein the protruding portion comprises a plurality of the first protruding portions spaced apart from each other; the first protruding portions are arranged as a ring.

4. The MEMS chip as described in claim 1, wherein the protruding portion comprises a plurality of the second protruding portions spaced apart from each other; the second protruding portions are arranged as a ring.

5. The MEMS chip as described in claim 1, wherein the protruding portion extends from the back plate towards the membrane; the membrane comprises a central portion and an edge portion surrounding the central portion; along the vibration direction, the first protruding portion faces the central portion and the second protruding portion faces the edge portion.

6. The MEMS chip as described in claim 1, wherein the membrane is located on one side of the back plate away from the back cavity; part of the membrane recessed towards the back plate forming the first protruding portion and the second protruding portion.

7. The MEMS chip as described in claim 6, wherein a plurality of through holes is provided on the back plate; the through holes penetrate the back plate along the vibration direction, connecting the back cavity and the inner cavity.

8. The MEMS chip as described in claim 5, wherein the capacitance system further comprises a plurality of elastic arms connecting the edge portion of the membrane and the first fixation portion.

* * * * *